US010147619B2

(12) United States Patent
Sato et al.

(10) Patent No.: US 10,147,619 B2
(45) Date of Patent: Dec. 4, 2018

(54) SUBSTRATE TREATMENT APPARATUS, SUBSTRATE TREATMENT METHOD, AND ETCHANT

(71) Applicant: Toshiba Memory Corporation, Tokyo (JP)

(72) Inventors: Katsuhiro Sato, Yokkaichi (JP); Kaori Deura, Yokohama (JP); Yoshinori Kitamura, Tsu (JP); Takahiro Terada, Yokohama (JP); Yoshihiro Ogawa, Yokkaichi (JP); Yuji Hashimoto, Yokkaichi (JP); Masaaki Hirakawa, Yokohama (JP); Yukako Murakami, Chigasaki (JP); Hideaki Hirabayashi, Yokohama (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/244,087

(22) Filed: Aug. 23, 2016

(65) Prior Publication Data
US 2017/0062231 A1   Mar. 2, 2017

(30) Foreign Application Priority Data

Aug. 27, 2015  (JP) .................................. 2015-167705
Dec. 18, 2015  (JP) .................................. 2015-247892
Jun. 27, 2016  (JP) .................................. 2016-126927

(51) Int. Cl.
| H01L 21/306 | (2006.01) |
| H01L 21/67 | (2006.01) |
| H01L 21/311 | (2006.01) |

(52) U.S. Cl.
CPC .. *H01L 21/67086* (2013.01); *H01L 21/30604* (2013.01); *H01L 21/30608* (2013.01); *H01L 21/31111* (2013.01)

(58) Field of Classification Search
CPC ......... H01L 21/31111; H01L 21/67086; H01L 21/30604; H01L 21/30608; H01L 21/6704;
(Continued)

(56) References Cited

U.S. PATENT DOCUMENTS

| 5,078,879 A | 1/1992 | Gill et al. |
| 5,422,084 A * | 6/1995 | Madic .................... C22B 3/065 |
| | | 423/20 |

(Continued)

FOREIGN PATENT DOCUMENTS

| JP | 5-104093 A | 4/1993 |
| JP | 6-349808 A | 12/1994 |

(Continued)

OTHER PUBLICATIONS

Xue-Qing Zhang, et al., "Mechanism of the Initial Stage of Silicate Oligomerization", Journal of the American Chemical Society, 2011, 133, pp. 6613-6625.

*Primary Examiner* — Lah Vinh

(74) *Attorney, Agent, or Firm* — Oblon, McClelland, Maier & Neustadt, L.L.P.

(57) ABSTRACT

A substrate treatment apparatus according to an embodiment includes a treatment part, a cyclic path, a heater, and a first injector. The treatment part is supplied with an etchant containing phosphoric acid and a silica deposition suppressor, and brings a substrate having a silicon nitride film on a surface thereof into contact with the etchant to remove the silicon nitride film from the substrate. The cyclic path circulates the etchant in the treatment part. The heater heats the etchant. The first injector is provided on the cyclic path, and injects the silica deposition suppressor into the etchant.

3 Claims, 13 Drawing Sheets

(58) Field of Classification Search
CPC ..... H01L 21/67075; C09G 1/00; C09K 13/00; C23F 1/10
USPC ............ 252/79.1, 79.2, 79.3; 438/750, 754; 216/99, 103
See application file for complete search history.

(56) References Cited

U.S. PATENT DOCUMENTS

| | | | |
|---|---|---|---|
| 5,470,421 | A | 11/1995 | Nakada et al. |
| 6,001,215 | A | 12/1999 | Ban |
| 6,037,269 | A | 3/2000 | Kim et al. |
| 7,635,397 | B2 | 12/2009 | Okuchi |
| 8,183,163 | B2 | 5/2012 | Eguchi et al. |
| 8,211,810 | B2 | 7/2012 | Kiyose |
| 8,821,752 | B2 | 9/2014 | Cho et al. |
| 9,368,647 | B2 * | 6/2016 | Hong ............... C09K 13/04 |
| 2006/0183338 | A1 * | 8/2006 | Kim ............... H01L 21/32134 438/745 |
| 2008/0064223 | A1 | 3/2008 | Eguchi et al. |
| 2008/0203060 | A1 | 8/2008 | Hara et al. |
| 2008/0305564 | A1 | 12/2008 | Okuchi |
| 2009/0081881 | A1 | 3/2009 | Kiyose |
| 2009/0101626 | A1 | 4/2009 | Arndt et al. |
| 2011/0212621 | A1 * | 9/2011 | Yoshida ............... C09G 1/02 438/693 |
| 2011/0256485 | A1 * | 10/2011 | Kim ............... C09K 13/06 430/323 |
| 2012/0074102 | A1 | 3/2012 | Magara et al. |
| 2013/0157427 | A1 | 6/2013 | Cho et al. |
| 2014/0231012 | A1 | 8/2014 | Hinode et al. |
| 2014/0290859 | A1 | 10/2014 | Kobayashi et al. |
| 2015/0307819 | A1 | 10/2015 | Ida et al. |
| 2016/0035597 | A1 | 2/2016 | Hinode et al. |
| 2016/0093515 | A1 | 3/2016 | Namba |
| 2016/0126107 | A1 | 5/2016 | Kil et al. |

FOREIGN PATENT DOCUMENTS

| | | |
|---|---|---|
| JP | 7-86260 A | 3/1995 |
| JP | 8-83792 A | 3/1996 |
| JP | 9-45660 A | 2/1997 |
| JP | 9-275091 A | 10/1997 |
| JP | 10-284467 A | 10/1998 |
| JP | 11-200072 A | 7/1999 |
| JP | 2000-58500 A | 2/2000 |
| JP | 2002-231676 A | 8/2002 |
| JP | 2003-224106 A | 8/2003 |
| JP | 2004-179310 A | 6/2004 |
| JP | 2005-203467 A | 7/2005 |
| JP | 3975333 B2 | 9/2007 |
| JP | 2007-258405 A | 10/2007 |
| JP | 2007-318057 A | 12/2007 |
| JP | 2008-47796 A | 2/2008 |
| JP | 2008-71801 A | 3/2008 |
| JP | 2008-305851 A | 12/2008 |
| JP | 2008-311436 A | 12/2008 |
| JP | 2009-21538 A | 1/2009 |
| JP | 2009-94455 A | 4/2009 |
| JP | 2009-206419 A | 9/2009 |
| JP | 2009-252773 A | 10/2009 |
| JP | 2010-74060 A | 4/2010 |
| JP | 2010-80603 A | 4/2010 |
| JP | 2011-40576 A | 2/2011 |
| JP | 2012-18981 A | 1/2012 |
| JP | 2012-18983 A | 1/2012 |
| JP | 2012-74601 A | 4/2012 |
| JP | 2012-99550 A | 5/2012 |
| JP | 4966223 B2 | 7/2012 |
| JP | 5035913 B2 | 7/2012 |
| JP | 2013-128109 A | 6/2013 |
| JP | 2014-82330 A | 5/2014 |
| JP | 2014-82333 A | 5/2014 |
| JP | 2014-99480 A | 5/2014 |
| JP | 2014-120533 A | 6/2014 |
| JP | 2014-157934 A | 8/2014 |
| JP | 2014-209581 A | 11/2014 |
| JP | 2016-32030 A | 3/2016 |
| JP | 2016-72445 A | 5/2016 |
| JP | 2016-92392 A | 5/2016 |

* cited by examiner

SUBSTRATE TREATMENT APPARATUS, SUBSTRATE TREATMENT METHOD, AND ETCHANT

CROSS REFERENCE TO RELATED APPLICATIONS

This application is based upon and claims the benefit of priority from the prior Japanese Patent Application No. 2015-167705, filed on Aug. 27, 2015, No. 2015-247892, filed on Dec. 18, 2015, and No. 2016-126927, filed on Jun. 27, 2016, the entire contents of which are incorporated herein by reference.

FIELD

The embodiments of the present invention relate to a substrate treatment apparatus, a substrate treatment method, and an etchant.

BACKGROUND

At a manufacturing step of a semiconductor device, etching processing is an important step for pattern formation, in which processing of selectively etching and removing a silicon nitride film out of the silicon nitride film and a silicon dioxide film formed on a substrate while leaving the silicon dioxide film is required. As a method of performing such selective etching processing of the silicon nitride film, a process of using a phosphoric acid aqueous solution of a high temperature (140° C. to 180° C.) as an etchant is known.

In the process of using a high-temperature phosphoric acid aqueous solution, a plurality of substrates having silicon nitride films and silicon dioxide films formed thereon, respectively, are dipped into a treatment tank in which a high-temperature phosphoric acid aqueous solution is retained to perform the selective etching processing of the silicon nitride films, for example. At that time, because of characteristics of the phosphoric acid aqueous solution, a slight amount of the silicon dioxide films is also etched. To address this problem, for example, a silicon compound is added to the phosphorous acid aqueous solution to enhance the silica concentration therein so as to increase the etching selectivity of the silicon nitride films against the silicon dioxide films. An increase in the etching selectivity of the silicon nitride films can suppress etching of the silicon dioxide films.

Generally, when the etching processing of the silicon nitride films is performed using the phosphoric acid aqueous solution, silica is accumulated in the phosphoric acid. If the silica concentration in the etchant is too low, the etching rate of the silicon dioxide films becomes high and the etching selectivity of the silicon nitride films becomes low. If the silica concentration is conversely too high, a problem that silica adheres to the treatment tank or clogs a filter occurs. Accordingly, when the etching processing using the phosphoric acid aqueous solution is to be performed, various silicon-based additives are used to adjust the silica concentration in the phosphoric acid to be fallen within an appropriate range corresponding to a treatment object.

In recent years, in a manufacturing process of a three-dimensional memory device, a stack film is formed on a wafer by alternately staking silicon dioxide films and silicon nitride films. To form word lines, select gates, and the like, the silicon nitride films in the stack film are selectively removed through a treatment with phosphoric acid having a predetermined silica concentration adjusted in advance.

However, in the three-dimensional memory device, because the amount of etching of the silicon nitride films is large, silica reaches the saturation concentration during the phosphoric acid treatment and deposits between layers of the silicon dioxide films, which leads to difficulty in forming wiring layers between the layers of the silicon dioxide films. With staking of more layers in a future three-dimensional memory, a larger etching amount of the silicon nitride films and a narrower margin for deposition of silica due to thinner silicon nitride films are expected and there is a concern that the problem of silica deposition becomes more serious. Therefore, to manufacture a three-dimensional memory with a high density at a high yield ratio, suppression of the silica deposition is demanded.

DETAILED DESCRIPTION

A substrate treatment apparatus according to an embodiment includes a treatment part, a cyclic path, a heater, and a first injector. The treatment part is supplied with an etchant containing phosphoric acid and a silica deposition suppressor, and brings a substrate having a silicon nitride film on a surface thereof into contact with the etchant to remove the silicon nitride film from the substrate. The cyclic path circulates the etchant in the treatment part. The heater heats the etchant. The first injector is provided on the cyclic path, and injects the silica deposition suppressor into the etchant.

Embodiments will now be explained with reference to the accompanying drawings. The present invention is not limited to the embodiments.

First Embodiment (Substrate Treatment Apparatus 1)

Figure 1:
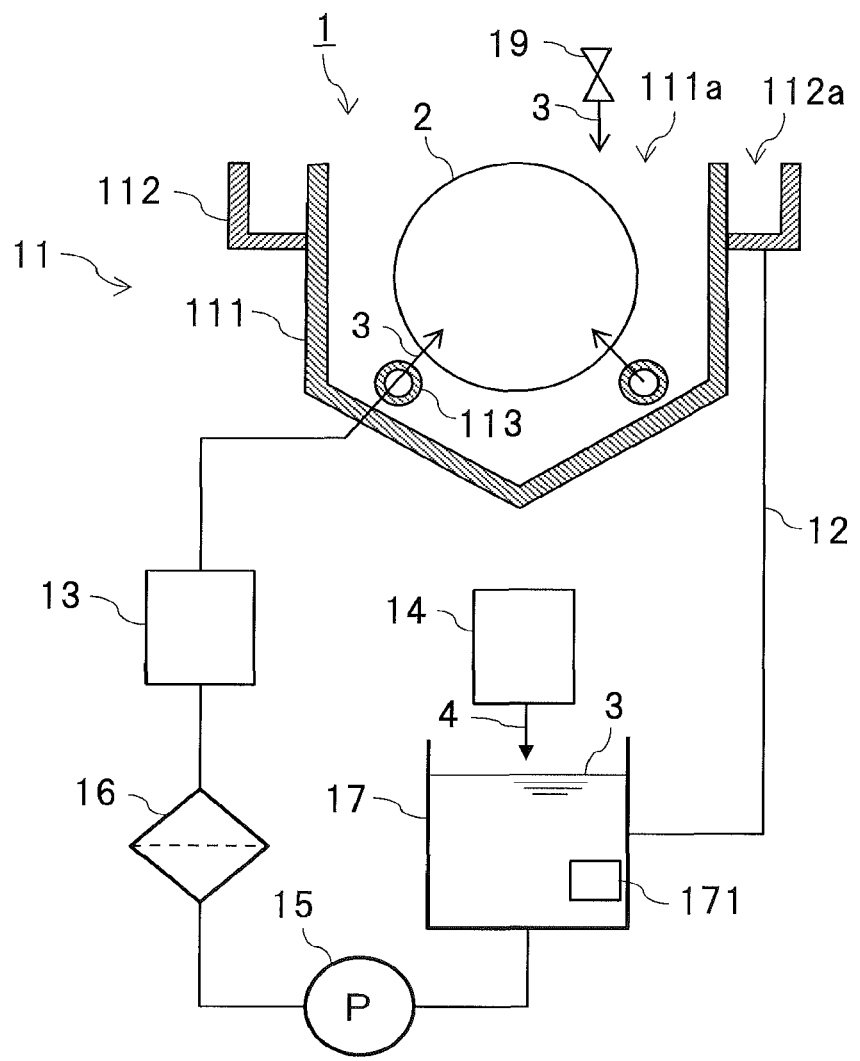
FIG. 1 is a diagram showing a substrate treatment apparatus according to a first embodiment.

FIG. 1 is a diagram showing a substrate treatment apparatus 1 according to a first embodiment. The substrate treatment apparatus 1 can be used as a wet etching processing apparatus that dips a substrate 2 having a silicon nitride film on the surface into a solution (hereinafter, also "phosphoric acid solution") containing phosphoric acid to selectively remove the silicon nitride film.

As shown in FIG. 1, the substrate treatment apparatus 1 includes a treatment tank 11 being an example of a treatment part, a cyclic path 12, a heater 13, and an injector 14 (first injector). The substrate treatment apparatus 1 also includes a pump 15, a filter 16, and an intermediate tank 17.

The treatment tank 11 includes an inner tank 111 and an outer tank 112. The inner tank 111 is formed in a box shape having an upper end opening 111a. A phosphoric acid solution 3, that is, an etchant is supplied into the inner tank 111. The inner tank 111 retains the supplied phosphoric acid solution 3 therein. The inner tank 111 causes the substrate 2 to be dipped into (that is, be brought into contact with) the retained phosphoric acid solution 3. Being dipped into the phosphoric acid solution 3, the silicon nitride film of the substrate 2 dissolves into the phosphoric acid solution 3 and is removed. The dipping of the substrate 2 into the phosphoric acid solution 3 can be achieved using a substrate holding mechanism and a substrate elevating mechanism (both not shown). The outer tank 112 entirely encompasses the circumference of an upper end portion of the inner tank 111. The outer tank 112 has an upper end opening 112a that encompasses the upper end opening 111a of the inner tank 111. The outer tank 112 recovers the phosphoric acid solution 3 having flowed over the upper end opening 111a of the inner tank 111. The treatment tank 11 can be a batch treatment tank that treats a plurality of the substrates 2 at the same time.

The cyclic path 12 causes a bottom portion of the outer tank 112 and a bottom portion of the inner tank 111 to be fluidically communicated with each other to circulate the phosphoric acid solution 3 in the treatment tank 11. The cyclic path 12 flows the phosphoric acid solution 3 having flowed over the inner tank 111 after removal of the silicon nitride film and retained in the outer tank 112 back to the inner tank 111. In the course of flowing back, the phosphoric acid solution 3 is treated by the heater 13, the injector 14, and the filter 16 to enable the silicon nitride film to be removed again.

The pump 15 is placed on the cyclic path 12. The pump 15 sucks the phosphoric acid solution 3 retained in the outer tank 112 to introduce the phosphoric acid solution 3 from the treatment tank 11 to the cyclic path 12. The pump 15 flows the phosphoric acid solution 3 introduced from the treatment tank 11 back to the inner tank 111 via the cyclic path 12.

The intermediate tank 17 is placed on the cyclic path 12 upstream from the pump 15. The intermediate tank 17 temporarily retains therein the phosphoric acid solution 3 to be flowed back.

The injector 14 is placed on the cyclic path 12 to face the intermediate tank 17. The injector 14 injects, that is, adds a silica deposition suppressor 4 to the phosphoric acid solution 3 retained in the intermediate tank 17. A specific mode of the injector 14 is not particularly limited and, for example, can include a weighing tank that weighs an amount of the silica deposition suppressor 4 and an injection valve that injects the weighed silica deposition suppressor 4. The intermediate tank 17 can alternatively be placed downstream from the pump 15. The injector 14 can be placed at a position facing the upper end opening 112a of the outer tank 112 to enable injection of the silica deposition suppressor 4 to the phosphoric acid solution 3 retained in the outer tank 112. In this case, the intermediate tank 17 can be omitted.

The phosphoric acid solution 3 is supplied from a supply valve 19 to the inner tank 111. The supply valve 19 can be installed to supply the phosphoric acid solution 3 to the outer tank 112 or can be installed to supply the phosphoric acid solution 3 to a route of the cyclic path 12 or the intermediate tank 17.

The silica deposition suppressor 4 suppresses deposition of silica on the substrate 2 along with removal of the silicon nitride film. For example, the silica deposition suppressor 4 suppresses deposition of silica between layers of silicon dioxide films when silicon nitride films are selectively removed by hot phosphoric acid treatment from a stack film including the silicon dioxide films and the silicon nitride films in a manufacturing process of a three-dimensional memory. The silica deposition suppressor 4 can have other objects or effects.

The silica deposition suppressor 4 is a compound containing an element that is a cation having an ionic radius of 0.2 Å to 0.9 Å. The ionic radius is the radius of an ion experimentally calculated from the sum of radii of an anion and a cation obtained from the lattice constant of a crystal lattice. The ionic radius of a cation is equal to or larger than 0.2 Å and increases according to the coordination number. A cation having an ionic radius equal to or larger than 1.0 Å has a large coordination number and thus is likely to be coordinate-bonded with water in phosphoric acid. The water in the phosphoric acid acts on removal of the silicon nitride film. Therefore, if the water coordinate-bonds with cations, removal of the silicon nitride film by etching is delayed. Furthermore, because the silica deposition is an equilibrium reaction accompanied with generation of water as represented by formula 1, the equilibrium is displaced to accelerate the silica deposition if a large amount of water is coordinate-bonded with cations.

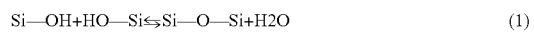

(1)

For this reason, the silica deposition suppressor 4 alternatively can contain an element that becomes a cation having a hydration number of 0 to 3.5 in the phosphoric acid solution 3. If the silica deposition suppressor 4 contains cations having a hydration number larger than 3.5, more water in the phosphoric acid is hydrated in the cations to displace the equilibrium reaction represented by formula 1 toward the right and thus silica becomes likely to deposit.

For example, the silica deposition suppressor 4 can contain oxide of any element of aluminum, potassium, lithium, sodium, magnesium, calcium, zirconium, tungsten, titanium, molybdenum, hafnium, nickel, and chromium. Alternatively, instead of the oxide of any of the elements or in addition thereto, the silica deposition suppressor 4 can contain at least one of nitride, chloride, bromide, hydroxide, and nitrate of any of the elements. For example, the silica deposition suppressor 4 can contain at least one of $Al(OH)_3$, $AlCl_3$, $AlBr_3$, $Al(NO)_3$, $Al_2(SO_4)_3$, $AlPO_4$, and $Al_2O_3$. Alternatively, the silica deposition suppressor 4 can contain at least one of KCl, KBr, KOH, and $KNO_3$. The silica deposition suppressor 4 alternatively can contain at least one of LiCl, NaCl, $MgCl_2$, $CaCl_2$, and $ZrCl_4$.

The filter 16 is placed on the cyclic path 12 downstream from the injector 14 and the pump 15. The filter 16 filters the phosphoric acid solution 3 to eliminate foreign substances (insoluble matters) in the phosphoric acid solution 3.

The heater 13 is placed on the cyclic path 12 downstream from the filter 16 and near the treatment tank 11. The heater 13 heats the phosphoric acid solution 3 to a predetermined temperature. The phosphoric acid solution 3 heated by the heater 13 is ejected into the inner tank 111 by an ejector 113 included in the inner tank 111. The heater 13 can be placed on the cyclic path 12 upstream from the filter 16.

With the substrate treatment apparatus 1, deposition of silica during removal of the silicon nitride film on the substrate 2 in the treatment tank 11 can be suppressed due to addition of the silica deposition suppressor 4 by the injector 14 into the phosphoric acid solution 3 circulating in the cyclic path 12.

(Substrate Treatment Method)

Figure 2:
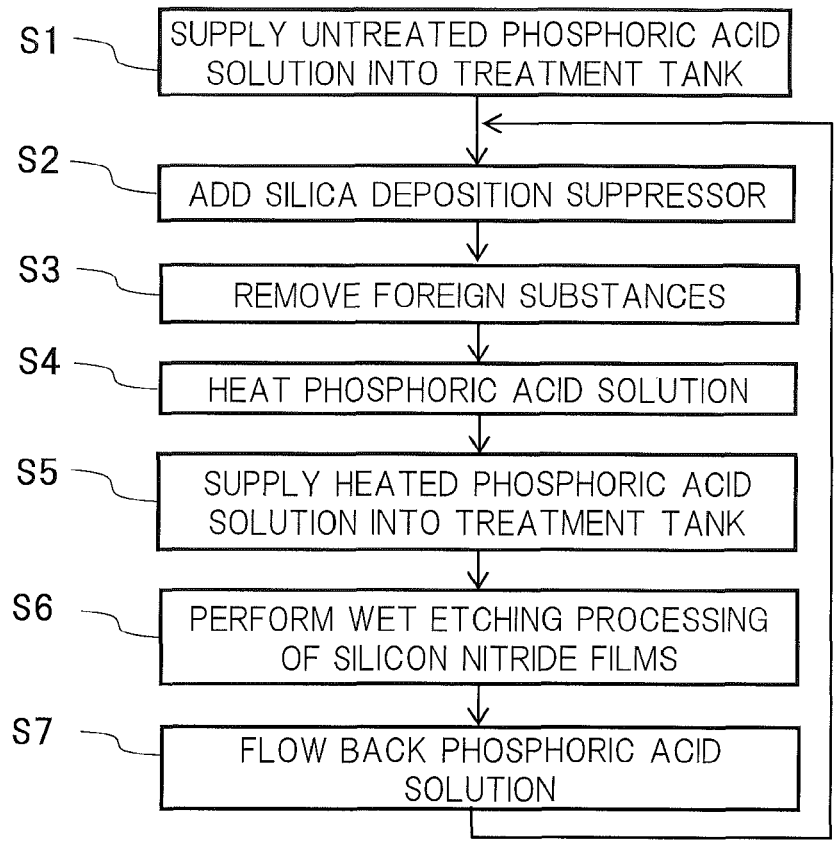
FIG. 2 is a flowchart showing a substrate treatment method according to the first embodiment.
Figure 3:
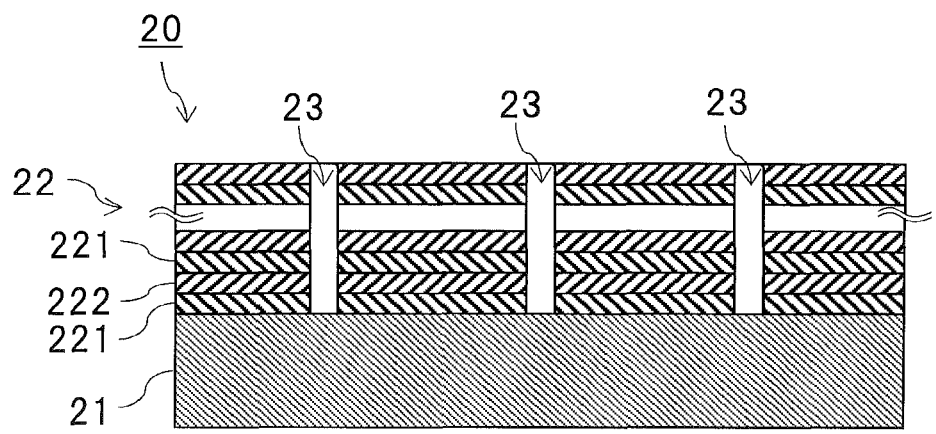
FIG. 3 is a schematic sectional view of a semiconductor substrate for manufacturing a three-dimensional memory.

A substrate treatment method to which the substrate treatment apparatus 1 shown in FIG. 1 is applied is explained next. FIG. 2 is a flowchart showing a substrate treatment method according to the first embodiment. FIG. 3 is a schematic sectional view of a semiconductor substrate 20 for manufacturing a three-dimensional memory. In the following substrate treatment method, the semiconductor substrate 20 shown in FIG. 3 is treated as an example. As shown in FIG. 3, the semiconductor substrate 20 has a stack film 22 including silicon dioxide films 221 and silicon nitride films 222 alternately stacked on a silicon substrate 21. The semiconductor substrate 20 also has trenches 23 extending through the stack film 22. It is assumed that the phosphoric acid solution 3 is not retained in the treatment tank 11 in an initial state of FIG. 2.

In the initial state, the supply valve 19 of the substrate treatment apparatus 1 first supplies an untreated phosphoric acid solution 3 into the inner tank 111 of the treatment tank 11 (Step S1). The untreated phosphoric acid solution 3 is a phosphoric acid solution 3 that has not been subjected to treatment required for removal of the silicon nitride films 222, such as heating and addition of a silica deposition suppressor, which will be described later. The untreated phosphoric acid solution 3 supplied into the inner tank 111 flows over the inner tank 111 to be retained in the outer tank 112. The untreated phosphoric acid solution 3 retained in the outer tank 112 is introduced by suction power of the pump 15 into the intermediate tank 17 located on the cyclic path 12. The untreated phosphoric acid solution 3 introduced into the intermediate tank 17 is temporarily retained in the intermediate tank 17. The supply valve 19 can be installed to supply the phosphoric acid solution 3 to the outer tank 112, or can be installed to supply the phosphoric acid solution 3 to the route of the cyclic path 12 or the intermediate tank 17.

Next, the injector 14 adds the silica deposition suppressor 4 to the untreated phosphoric acid solution 3 retained in the intermediate tank 17 (Step S2). At that time, the injector 14 can add the silica deposition suppressor 4 to the phosphoric acid solution 3 in such a manner that the silica deposition suppressor 4 in the phosphoric acid solution 3 has a concentration of 0.01 mol/L to 0.5 mol/L based on a detection result of a concentration meter 171 installed in the intermediate tank 17.

If the amount of the silica deposition suppressor 4 added to the phosphoric acid solution 3 is less than 0.01 mol/L, sufficient suppression of silica deposition between layers of the silicon dioxide films 221 may become difficult. On the other hand, if the amount of the silica deposition suppressor 4 added to the phosphoric acid solution 3 is more than 0.5 mol/L, the silica deposition suppressor 4 may remain between the layers of the silicon dioxide films 221. Therefore, by setting the addition amount of the silica deposition suppressor 4 to be not less than 0.01 mol/L and not more than 0.5 mol/L, deposition of silica and remaining of the silica deposition suppressor 4 can be both suppressed.

Subsequently, the filter 16 removes foreign substances from the phosphoric acid solution 3 having the silica deposition suppressor 4 added thereto (Step S3).

Next, the heater 13 heats the phosphoric acid solution 3 from which the foreign substances have been removed (Step S4).

Subsequently, the pump 15 supplies the heated phosphoric acid solution 3 into the treatment tank 11 (Step S5).

Next, the semiconductor substrate 20 is dipped into the heated phosphoric acid solution 3 in the treatment tank 11 to perform wet etching processing of the silicon nitride films 222 (Step S6). At that time, the phosphoric acid solution 3 becomes in contact with the layers of the stack film 22 via the trenches 23 of the semiconductor substrate 20 to selectively remove the silicon nitride films 222. The phosphoric acid solution 3 used in the etching processing flows over the inner tank 111 to be retained in the outer tank 112.

Subsequently, the pump 15 sucks the phosphoric acid solution 3 retained in the outer tank 112 to flow back the phosphoric acid solution 3 through the cyclic path 12 (Step S7). In the course of flowing back, the addition of the silica deposition suppressor 4 (Step S2), the removal of foreign substances (Step S3), the heating (Step S4), and the supply to the treatment tank 11 (Step S5) are performed again to the phosphoric acid solution 3. These processes to the phosphoric acid solution 3 associated with circulation of the phosphoric acid solution 3 can be repeated for a required time of the wet etching. The addition of the silica deposition suppressor 4 (Step S2) can be omitted when the concentration of the silica deposition suppressor 4 in the phosphoric acid solution 3 is within the range not less than 0.01 mol/L and not more than 0.5 mol/L.

Figure 4:
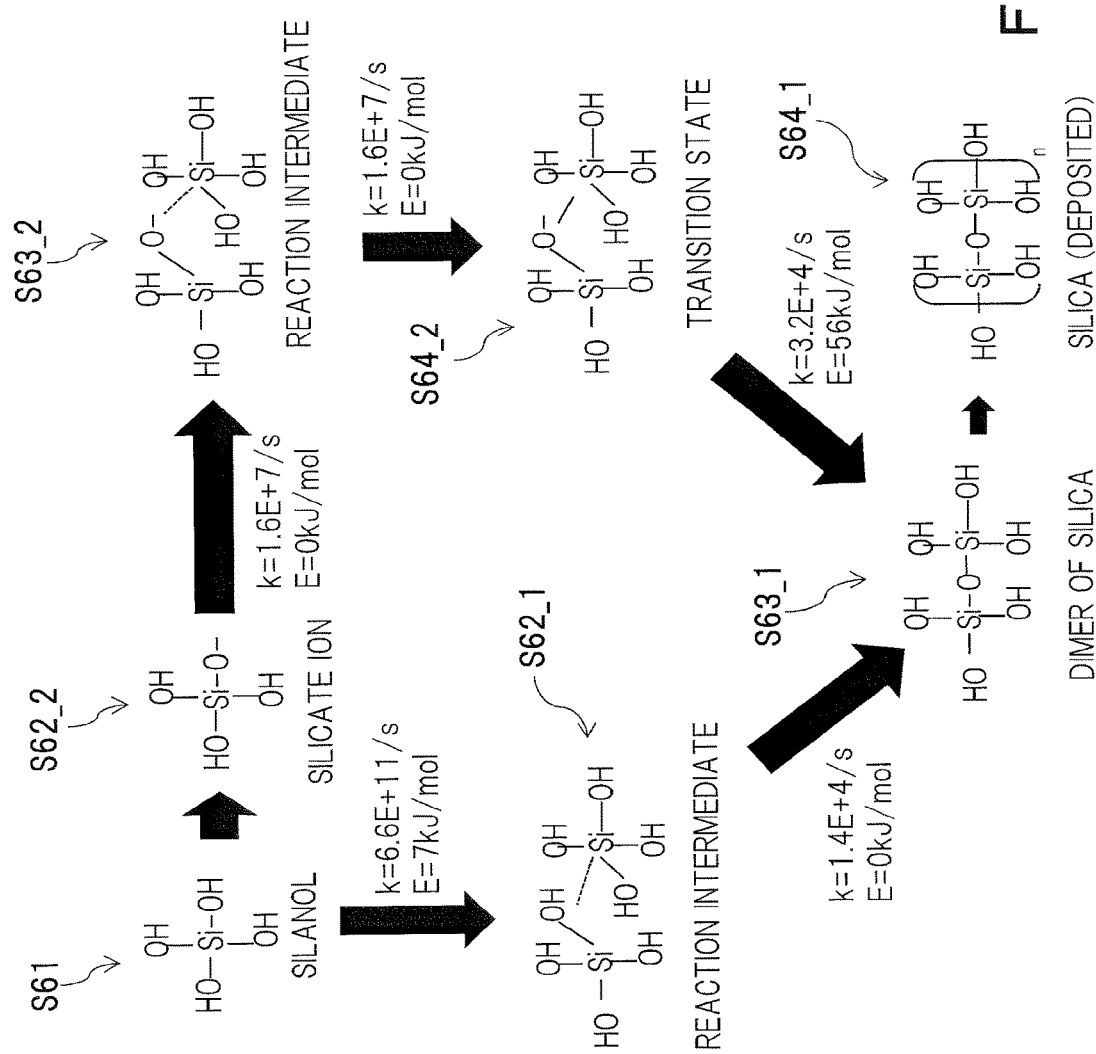
FIG. 4 is an explanatory diagram for explaining an example of actions of the first embodiment.

Actions of the silica deposition suppressor 4 in the etching processing (Step S6) shown in FIG. 2 are explained next. FIG. 4 is an explanatory diagram for explaining an example of actions of the present embodiment. The actions shown in FIG. 4 are based on DFT (density functional theory) calculation (see 3. Am. Chem. Soc. 2011, 133, 6613-6625). First, in the etching processing of the silicon nitride films 222 (Step S6), silanols ($Si(OH)_4$) are generated (Step S61).

If the silica deposition suppressor 4 is not added to the phosphoric acid solution 3, a polymerization reaction between silanols progresses to generate reaction intermediates (Step S62_1). The reaction rate constant in the generation of the reaction intermediates is 6.6E+11/s and the activation energy is 7 kJ/mol. Next, dimers ((HO)$_3$Si—O—Si(OH)$_3$) of silica are generated based on the reaction intermediates (Step S63_1). The reaction rate constant in the generation of the dimers of silica is 1.4E+4/s and the activation energy is 0 kJ/mol. The dimers of silica are polymerized to generate silica polymers and the generated polymers deposit (Step S64_1).

In contrast thereto, in the present embodiment, after the silanols are generated (Step S61), the silanols are ionized by the silica deposition suppressor 4 to generate silicate ions (Si(OH)$_3$O$^-$) (Step S62_2). Reaction intermediates are generated based on the silicate ions (Step S63_2). The reaction rate constant in the generation of the reaction intermediates is 1.6E+7/s and the activation energy is 0 kJ/mol. Next, a transition state is formed (Step S64_2). The reaction rate constant in the formation of the transition state is 1.6E+7/s and the activation energy is 0 kJ/mol. Subsequently, dimers of silica are generated based on the transition state (Step S63_1). The reaction rate constant in the generation of the dimers of silica is 3.2E+4/s and the activation energy is 56 kJ/mol. Thereafter, silica polymers deposit similarly to the case where the silica deposition suppressor 4 is not added (Step S64_1).

As described above, in the case where the silica deposition suppressor 4 is added, the reaction rate constant at a rate-limiting reaction step in which the activation energy of the polymerization reaction is high is smaller than that in the case where the silica deposition suppressor 4 is not added. It is considered that silica does not polymerize and deposit easily because silica tends to polymerize in an ionized state when the silica deposition suppressor 4 is added.

From the above consideration, it is kinetically apparent that deposition of silica can be suppressed by addition of the silica deposition suppressor 4.

In terms of effectively suppressing the deposition of silica, the content ratios, that is, the weight concentration ratios of components of the etchant in the treatment tank 11 are preferably 75 to 94 wt % of the phosphoric acid, 0.01 to 3.2 wt % (that is, 0.01 to 0.5 mol/L) of the silica deposition suppressor, and 2.8 to 24.9 wt % of water.

Alternatively, an etchant containing 75 to 94 wt % of the phosphoric acid, 0.01 to 3.2 wt % of the silica deposition suppressor, and 2.8 to 24.9 wt % of water can be directly supplied to the treatment tank 11.

First Experimental Example

Figure 5:
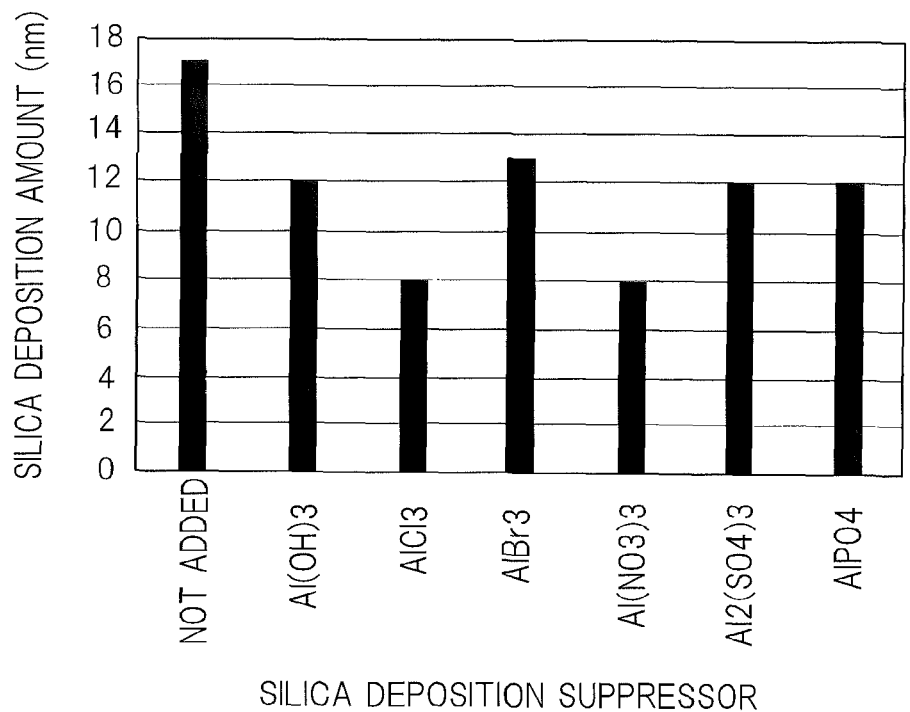
FIG. 5 is a graph showing a first experimental example of the first embodiment.

A first experimental example of the first embodiment is explained next. FIG. 5 is a graph showing the first experimental example of the first embodiment.

In the first experimental example, a beaker that had stored therein a phosphoric acid solution containing 85 wt % of phosphoric acid was put in an oil bath and the phosphoric acid solution in the beaker was heated to 155° C. in the oil bath. At that time, a silica deposition suppressor was added to the beaker to which the substrate treatment method of the present embodiment was applied and agitated. As the silica deposition suppressor, six types of compounds Al(OH)$_3$, AlCl$_3$, AlBr$_3$, Al(NO$_3$)$_3$, Al$_2$(SO$_4$)$_3$, and AlPO$_4$ were adopted. These six types of compounds were added to phosphoric acid solutions in different beakers, respectively. Meanwhile, no silica deposition suppressor was added to a beaker to which a substrate treatment method of a comparative example was applied. The semiconductor substrate 20 was dipped into the heated phosphoric acid solution for 15 minutes. After dipped, the semiconductor substrate 20 was rinsed with pure water for 60 seconds and dried. The semiconductor substrate 20 was then observed with a SEM (Scanning Electron Microscope). FIG. 5 shows deposition amounts of silica detected based on observation results with the SEM.

As shown in FIG. 5, it was found that the deposition amounts of silica were smaller in the cases where the silica deposition suppressor was added than in the case where no silica deposition suppressor was added.

As is understood from the above, it is experimentally apparent that addition of the silica deposition suppressor can suppress generation of silica.

Second Experimental Example

Figure 6:
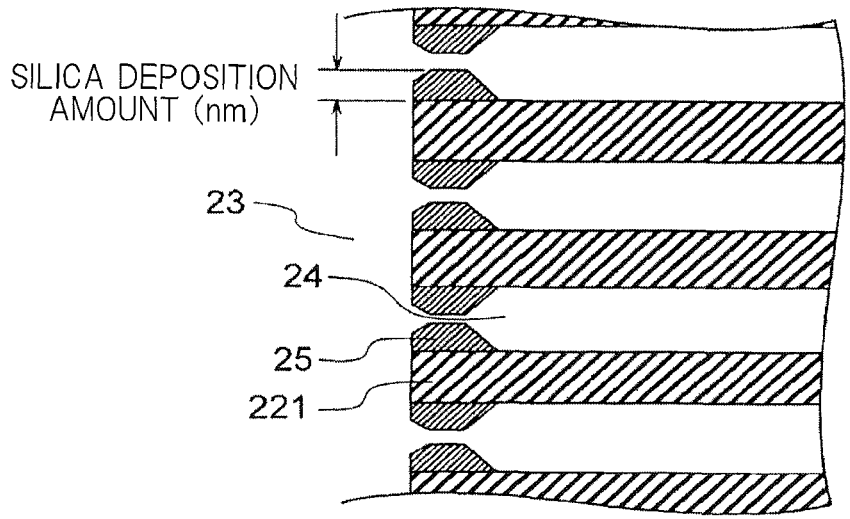
FIG. 6 is a sectional view showing a silica deposition amount in a second experimental example of the first embodiment.

A second experimental example of the first embodiment in which the types of the silica deposition suppressors are increased relative to the first experimental example is explained next. FIG. 6 is a sectional view showing a silica deposition amount in the second experimental example.

In the second experimental example, as the silica deposition suppressor including an aluminum compound to be added to the phosphoric acid solution in the beaker, Al$_2$O$_3$ was adopted in addition to the six aluminum compounds described in the first experimental example. In the second experimental example, KCl, KBr, KOH, and KNO$_3$ were also adopted as the silica deposition suppressor including a potassium compound. In the second experimental example, LiCl, NaCl, KCl, MgCl$_2$, CaCl$_2$, and ZrCl$_4$ were further adopted as the silica deposition suppressor including a chloride compound. In the second experimental example, the concentrations of the various silica deposition suppressors are uniformly set to 0.1 mol/L.

In the second experimental example, after the silicon nitride films 222 (see FIG. 3) were removed with the phosphoric acid solution in the beaker similarly in the first experimental example, the deposition amount of silica deposited in cavities 24 formed by removal of the silicon nitride films 222 near the trenches 23 as shown in FIG. 6 was calculated. The results are shown in FIGS. 7 to 9.

Figure 7:
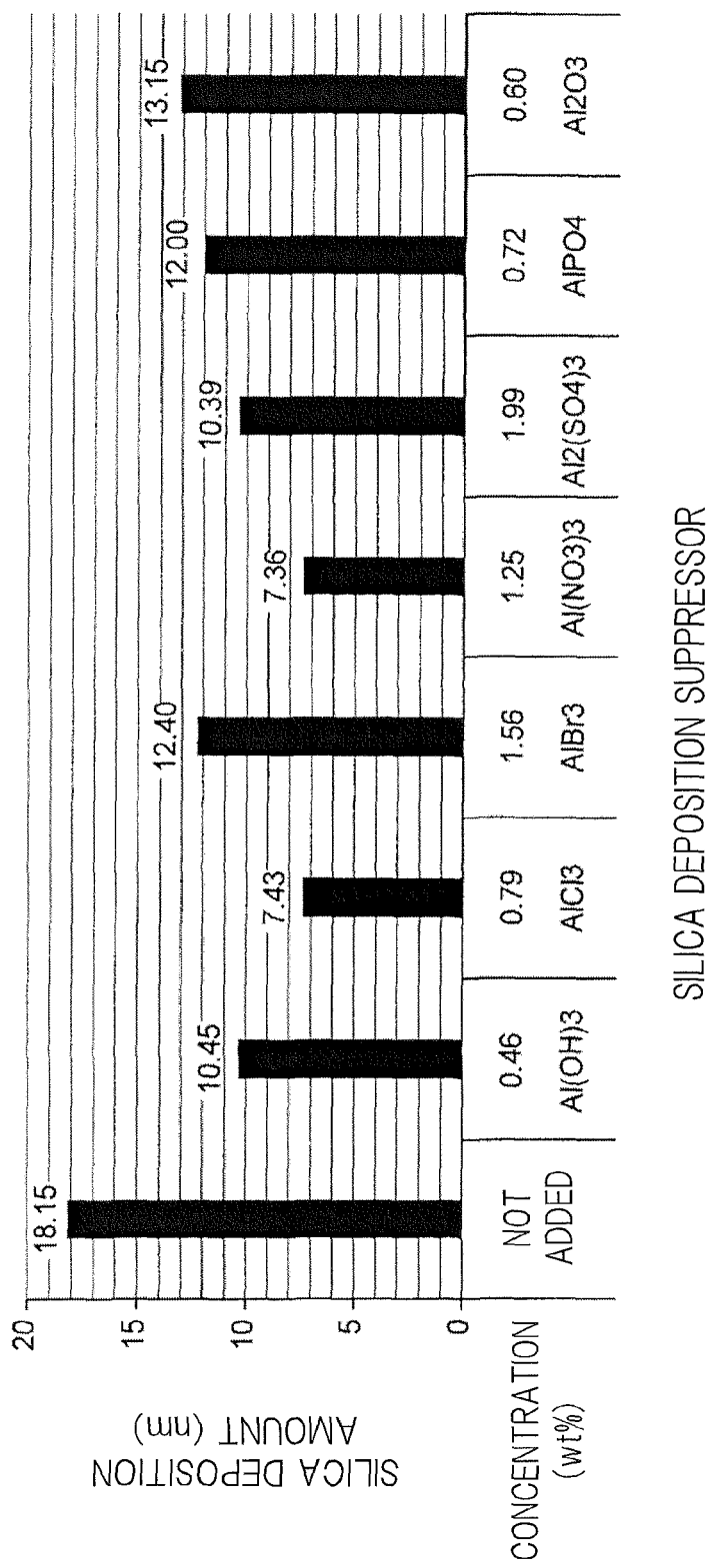
FIG. 7 is a graph showing silica deposition amounts in a case where aluminum compounds are added as a silica deposition suppressor in the second experimental example of the first embodiment.

FIG. 7 is a graph showing the silica deposition amounts in a case where the aluminum compounds were added as the silica deposition suppressor in the second experimental example. FIG. 8 is a graph showing the silica deposition amounts in a case where the potassium compounds were added as the silica deposition suppressor in the second experimental example. FIG. 9 is a graph showing the silica deposition amounts in a case where the chloride compounds were added as the silica deposition suppressor in the second experimental example.

Figure 8:
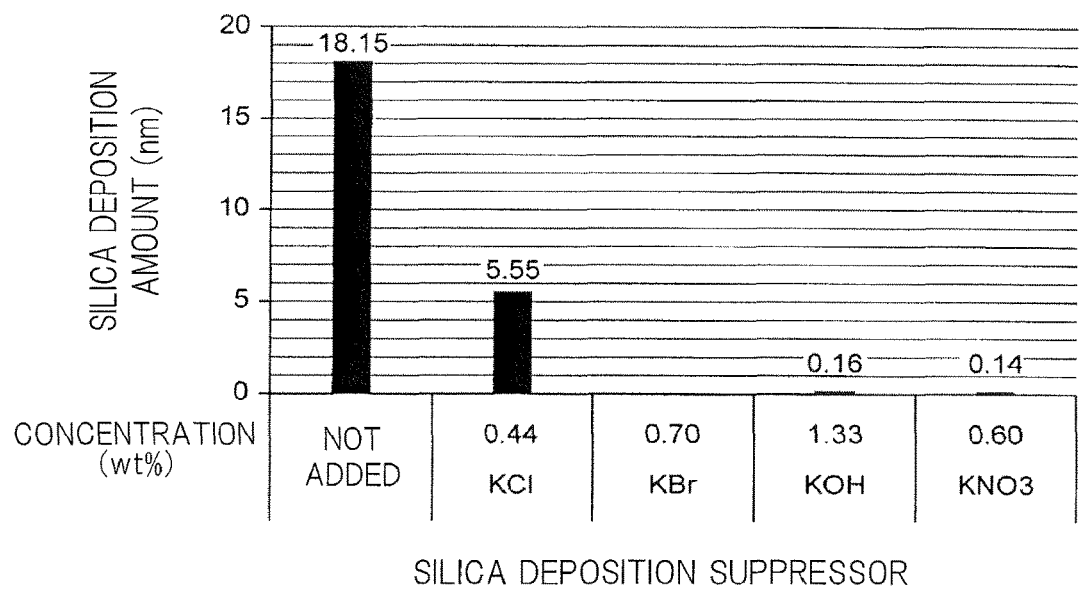
FIG. 8 is a graph showing silica deposition amounts in a case where potassium compounds are added as the silica deposition suppressor in the second experimental example of the first embodiment.
Figure 9:
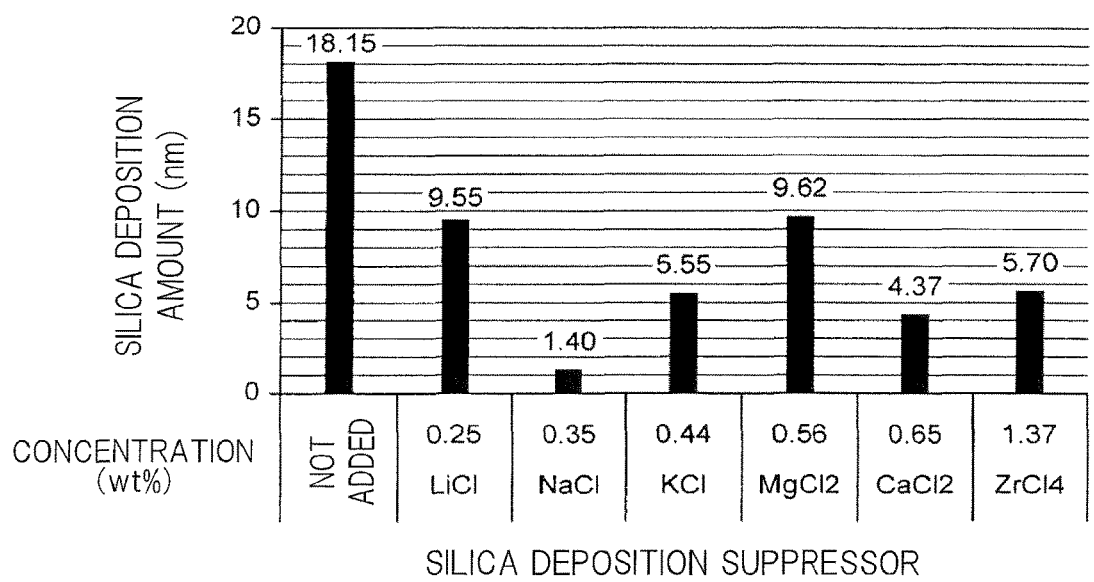
FIG. 9 is a graph showing silica deposition amounts in a case where chloride compounds are added as the silica deposition suppressor in the second experimental example of the first embodiment.

As shown in FIGS. 7 to 9, the second experimental example indicated that any type of the silica deposition suppressors reduced the silica deposition amount relative to the case where no silica deposition suppressor was added when the concentration of the silica deposition suppressor was set to 0.1 mol/L.

Third Experimental Example

A third experimental example of the first embodiment in which the concentrations of the silica deposition suppressors were changed is explained next. In the third experimental example, changes in the silica deposition amount with changes in the concentration of the silica deposition suppressor were examined for several types of the silica deposition suppressors adopted in the first experimental example. The results are shown in FIGS. 10 and 11.

Figure 10:
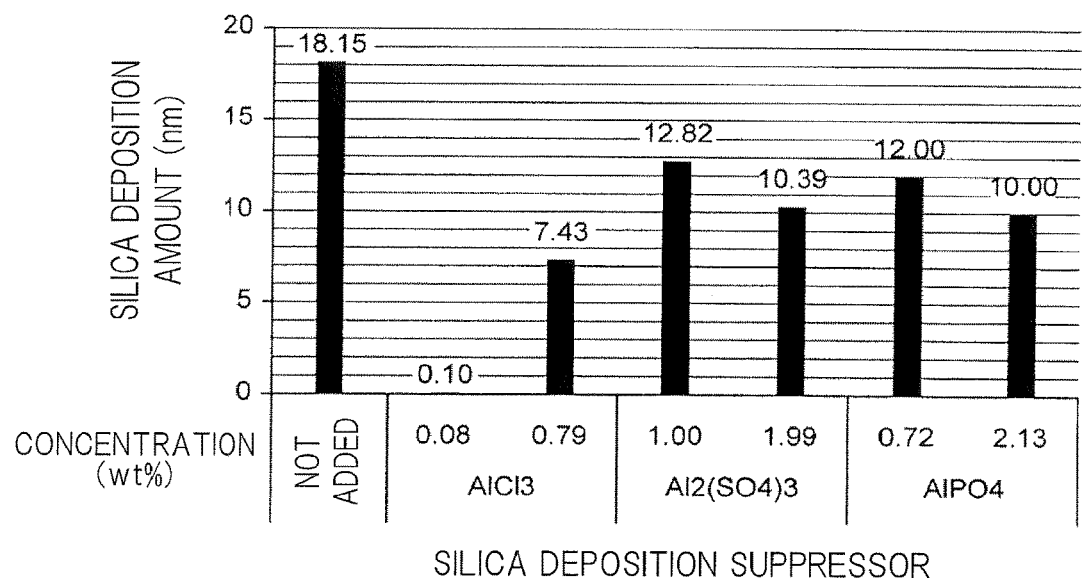
FIG. 10 is a graph showing the dependency of the silica deposition amount on the concentration of an added aluminum compound in a third experimental example of the first embodiment.

FIG. 10 is a graph showing the dependency of the silica deposition amount on the concentration of the added aluminum compound in the third experimental example. FIG. 11 is a graph showing the dependency of the silica deposition amount on the concentration of the added chloride compound in the third experimental example.

Figure 11:
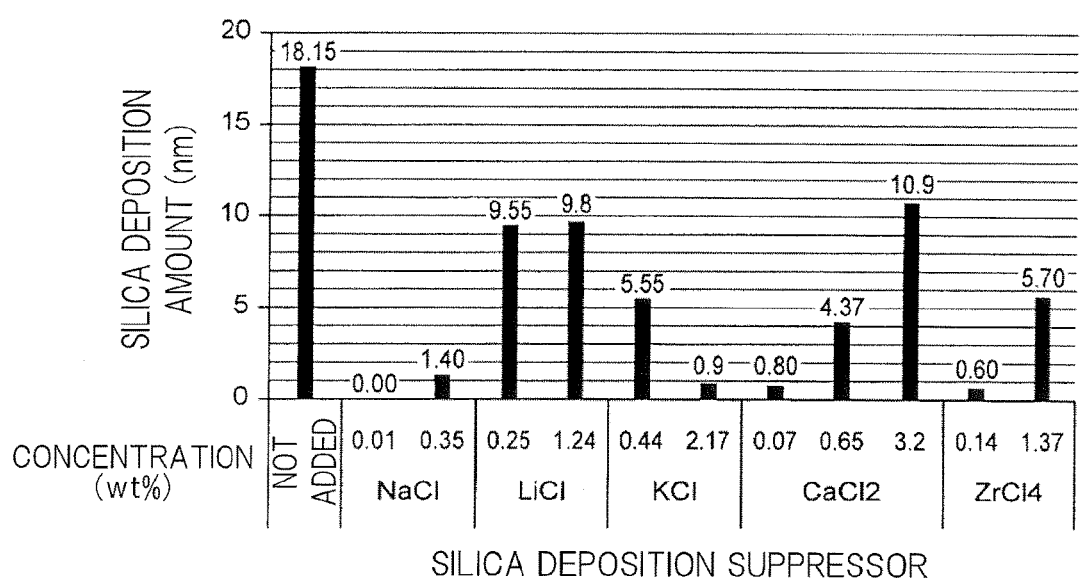
FIG. 11 is a graph showing the dependency of the silica deposition amount on the concentration of an added chloride compound in the third experimental example of the first embodiment.

As shown in FIGS. 10 and 11, the third experimental example indicated that any type of the silica deposition suppressors in FIGS. 10 and 11 reduced the silica deposition amount relative to the case where no silica deposition suppressor was added when the concentration of the silica suppressor was set to 0.01 to 3.2 wt %.

As explained above, according to the first embodiment, when the silicon nitride films 222 in the stack film 22 are etched using the phosphoric acid solution having the silica deposition suppressor added thereto, deposition of silica associated with the etching can be suppressed. Because the silica deposition can be suppressed, a three-dimensional memory with a high density can be manufactured at a high yield ratio.

The present embodiment can also be applied to treat a substrate for purposes other than a three-dimensional memory, such as a substrate for MEMS (Micro Electro Mechanical Systems).

Second Embodiment

Figure 12:
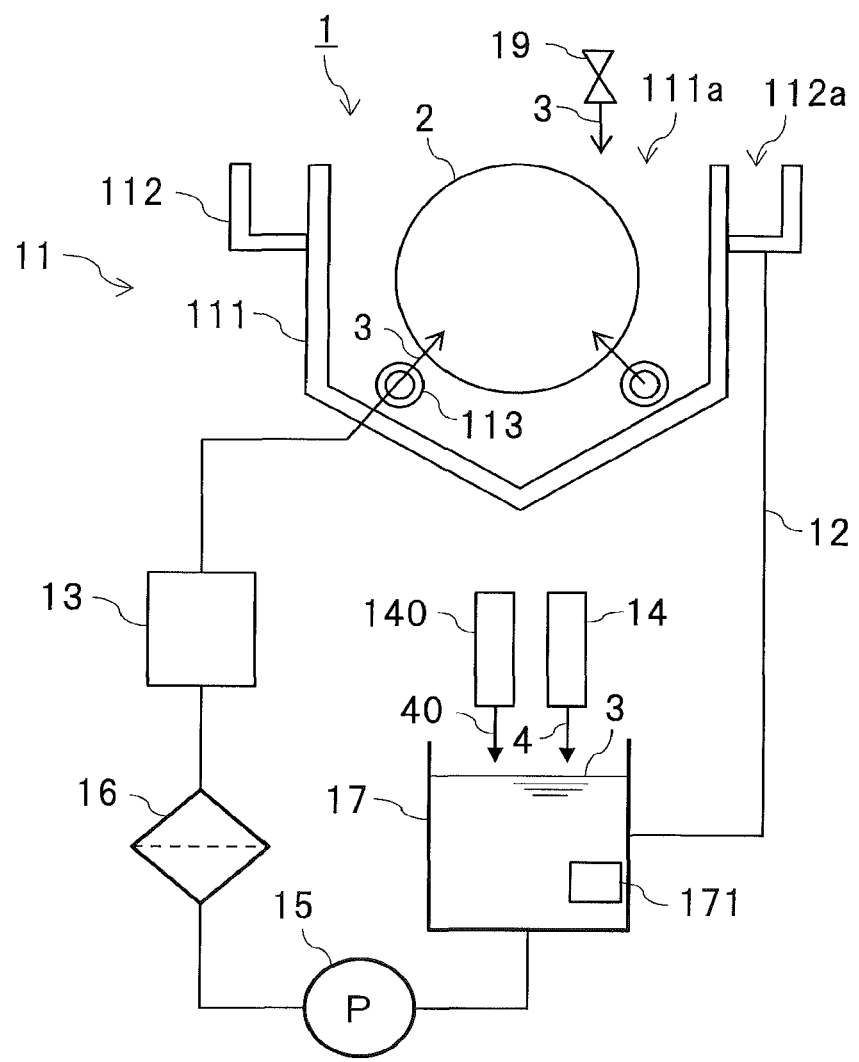
FIG. 12 is a diagram showing a substrate treatment apparatus according to a second embodiment.

An embodiment in which silicon nitride films are etched with an etchant containing an oxidant is explained next as a second embodiment. In the second embodiment, constituent parts corresponding to those in the first embodiment are denoted by like reference characters and redundant descriptions thereof will be omitted. FIG. 12 is a diagram showing the substrate treatment apparatus 1 according to the second embodiment.

As shown in FIG. 12, the substrate treatment apparatus 1 according to the second embodiment further includes a second injector 140 in addition to the configuration of the substrate treatment apparatus 1 according to the first embodiment. The second injector 140 is placed on the cyclic path 12 to face the intermediate tank 17. The second injector 140 is located side by side with the injector 14 in a direction orthogonal to the injection direction of the silica deposition suppressor 4 (a horizontal direction in FIG. 12).

The second injector 140 injects an oxidant 40 to the phosphoric acid solution 3 retained in the intermediate tank 17. A specific mode of the second injector 140 is not particularly limited and the second injector 140 can include, for example, a weighing tank that weighs an amount of the oxidant 40 and an injection valve that injects the weighed oxidant 40.

The oxidant 40 is supplied into the treatment tank 11 through the cyclic path 12 and accelerates etching of the silicon nitride films 222 (see FIG. 3) in the treatment tank 11. The silicon nitride films 222 are etched with water included in the phosphoric acid solution 3. That is, oxygen atoms in water molecules are bonded with silicon atoms in the silicon nitride films 222 to form Si—O bonds, and Si—N bonds in the silicon nitride films 222 are broken. When this reaction is repeated, silanols are generated, which progresses the etching of the silicon nitride films 222.

The oxidant 40 has a redox potential equal to or higher than 1.0 V, that is, has high oxidation power. Due to having the redox potential equal to or higher than 1.0 V, the oxidant 40 can oxidize silicon in the silicon nitride films 222 and break the Si—N bonds. In the silicon nitride films 222 having some of the Si—N bonds broken by the oxidant 40, bonding with the oxygen atoms in water molecules included in the phosphoric acid solution 3 is accelerated. Accordingly, the phosphoric acid solution 3 containing the oxidant 40 has a higher etching rate of the silicon nitride films 222 than a phosphoric acid solution that does not contain the oxidant 40. The oxidant 40 can have other objects or effects.

The oxidant 40 can be, for example, cerium (IV), manganese (VII), peroxymonosulfuric acid, peroxydisulfuric acid, hydrogen peroxide, ozone, or perchloric acid. The oxidant 40 is not limited thereto as long as it is an oxidant having a redox potential equal to or higher than 1.0 V.

From the viewpoint of effectively suppressing the silica deposition and effectively increasing the etching rate of the silicon nitride films 222, the content ratios of components of the etchant in the treatment tank 11 are preferably 75 to 94 wt % of the phosphoric acid, 0.01 to 3.2 wt % (0.01 to 0.5 mol/L) of the silica deposition suppressor, 0.01 to 2.0 wt % (0.01 to 0.2 mol/L) of the oxidant, and 2.8 to 24.9 wt % of water.

If the amount of the oxidant 40 added to the phosphoric acid solution 3 is less than 0.01 mol/L, sufficient acceleration of the etching rate of the silicon nitride films 222 may be difficult. On the other hand, when the amount of the oxidant 40 added to the phosphoric acid solution 3 is more than 0.2 mol/L, the oxidant 40 may remain between the layers of the silicon dioxide films 221. Therefore, by setting the addition amount of the oxidant 40 to be not less than 0.01 mol/L and not more than 0.2 mol/L, remaining of the oxidant 40 can be suppressed while the etching rate of the silicon nitride films 222 is increased.

Alternatively, an etchant containing 75 to 94 wt % of the phosphoric acid, 0.01 to 3.2 wt % of the silica deposition suppressor, 0.01 to 2.0 wt % of the oxidant, and 2.8 to 24.9 wt % of water can be directly supplied to the treatment tank 11.

Experimental Example

An experimental example of the second embodiment is explained next. In the present experimental example, cerium dioxide having a redox potential of +1.72 V was added to the phosphoric acid solution to be 1.0 wt % (0.1 mol/L) in an identical beaker to that in the first experimental example of the first embodiment as an oxidant instead of the silica deposition suppressor. In an identical manner to that in the first experimental example of the first embodiment, the silicon nitride films 222 were etched with the phosphoric acid solution in the beaker and the etching rate was measured. The etching rate was obtained as a normalized etching rate in which an etching rate in a case where no oxidant is added is regarded as 1. The result is shown in FIG. 13.

Figure 13:
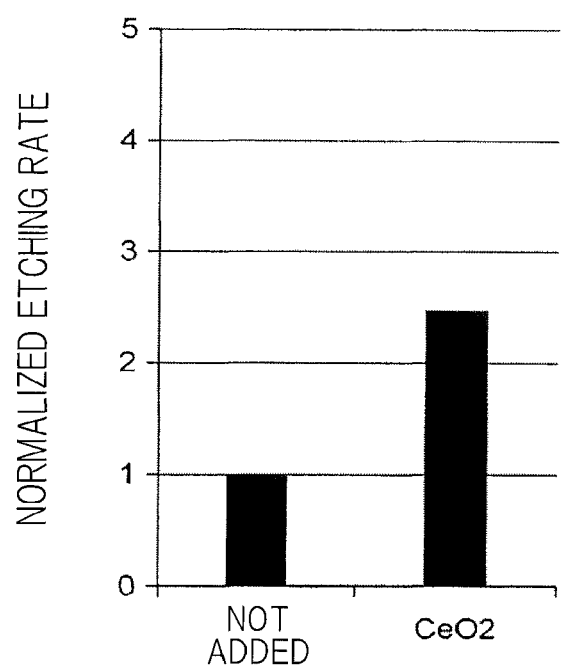
FIG. 13 is a graph showing a correlation between an oxidant and an etching rate in an experimental example of the second embodiment.

FIG. 13 is a graph showing a correlation between the oxidant and the etching rate in the experimental example of the second embodiment. As shown in FIG. 13, the present experimental example indicated that addition of the oxidant could increase the etching rate relative to the case where no oxidant was added.

Third Embodiment

Figure 14:
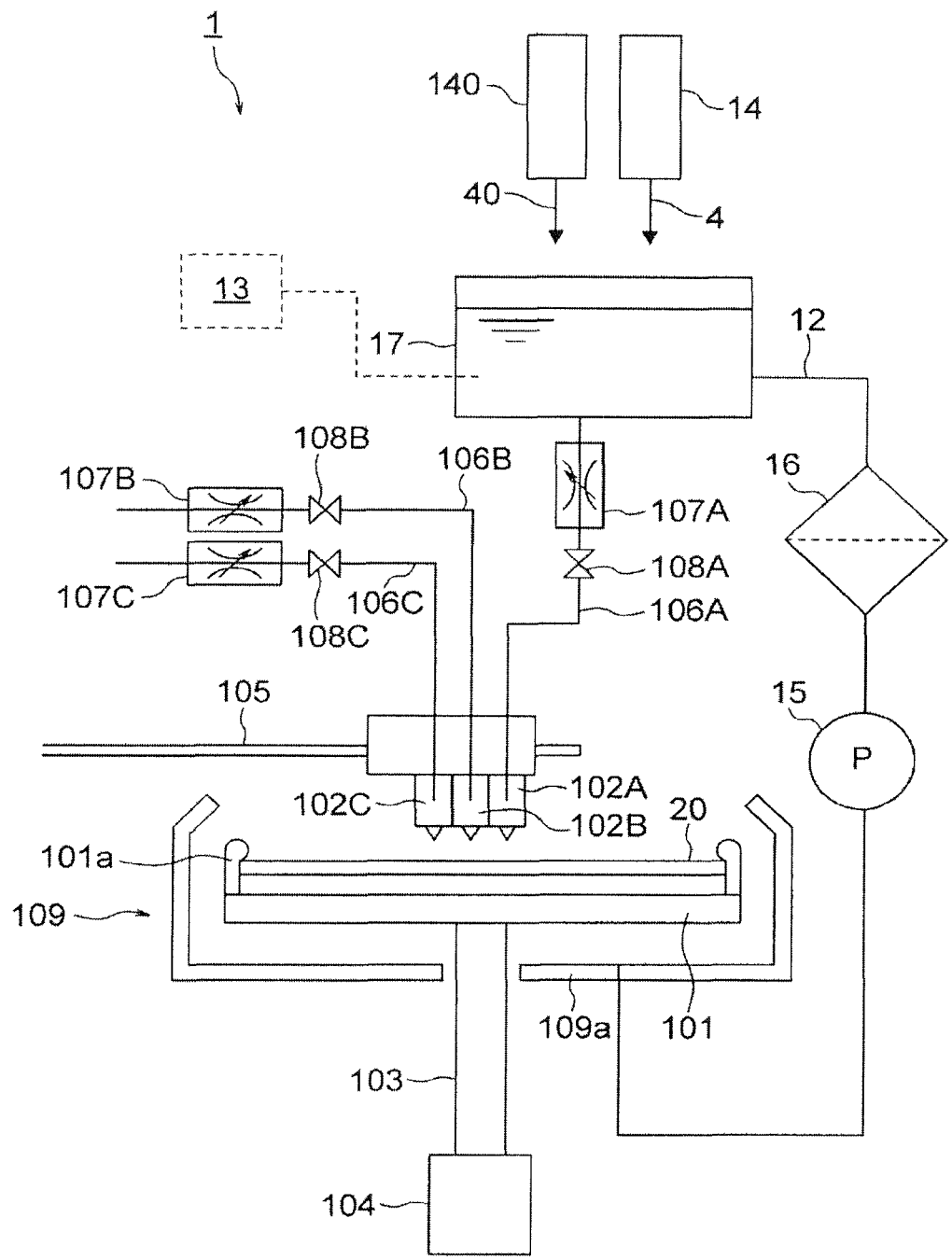
FIG. 14 is a diagram showing a substrate treatment apparatus according to a third embodiment.

A single-wafer-processing substrate treatment apparatus is explained next as a third embodiment. In the third embodiment, constituent parts corresponding to those in the first and second embodiments are denoted by like reference characters and redundant descriptions thereof will be omitted. FIG. 14 is a diagram showing the substrate treatment apparatus 1 according to the third embodiment.

In the first and second embodiments, the semiconductor substrates 20 are treated in batch processing. In contrast thereto, in the third embodiment, the semiconductor substrates 20 are treated in single wafer processing. To treat the semiconductor substrates 20 in single wafer processing, the substrate treatment apparatus 1 according to the third embodiment includes a substrate holder 101 and nozzles 102A to 102C instead of the treatment tank 11 as a processing part. The substrate treatment apparatus 1 according to the third embodiment further includes a rotating shaft 103, a rotation driver 104, an arm 105, fluid conduits 106A to 106C, flow-rate adjustment valves 107A to 107C, on-off valves 108A to 108C, and a cup 109 as constituent parts different from those in the first and second embodiments.

In the third embodiment, the phosphoric acid solution 3 is supplied in advance to the intermediate tank 17. The heater 13 is provided to the intermediate tank 17 to enable the phosphoric acid solution 3 in the intermediate tank 17 to be heated.

The substrate holder 101 has a horizontal disk shape and has a plurality of chuck pins 101a protruding upward on an outer circumferential edge of the top surface thereof. By nipping the semiconductor substrate 20 with the chuck pins 101a, the substrate holder 101 holds the substrate 20 substantially horizontally.

The rotating shaft 103 extends downward from a central portion of the substrate holder 101 and is coupled to the rotation driver 104 at a lower end portion thereof. The substrate holder 101 can be rotated on the rotating shaft 103 with drive force of the rotation driver 104.

To supply the phosphoric acid solution 3 to the semiconductor substrate 20, the nozzle 102A is communicated with the intermediate tank 17 through the fluid conduit 106A. The fluid conduit 106A is a part of a cyclic path. To control the supply of the phosphoric acid solution 3, the fluid-rate adjustment valve 107A and the on-off valve 108A are placed on the fluid conduit 106A at a predetermined distance. The nozzle 102A is fixed to the arm 105 and the arm 105 can be horizontally moved by a movement device (not shown) above the substrate holder 101. With movement of the arm 105 toward the central portion of the semiconductor substrate 20, the nozzle 102A faces the central portion of the semiconductor substrate 20. In a state of facing the central portion of the semiconductor substrate 20, the nozzle 102A ejects the phosphoric acid solution 3 delivered from the intermediate tank 17 to the semiconductor substrate 20. When the phosphoric acid solution 3 is ejected, the rotation driver 104 rotates the substrate holder 101 to rotate the semiconductor substrate 20. By ejecting the phosphoric acid solution 3 to the central portion of the semiconductor substrate 20 being rotated, the phosphoric acid solution 3 can be applied uniformly throughout the semiconductor substrate 20. Accordingly, the silicon nitride films 222 of the semiconductor substrate 20 can be removed with the phosphoric acid solution 3 evenly and efficiently. The nozzle 102A can eject the phosphoric acid solution 3 obliquely toward the central portion of the semiconductor substrate 20 at a position facing a peripheral portion of the semiconductor substrate 20.

The cup 109 has a substantially cylindrical shape with an upper end open and is placed around the substrate holder 101 to cover the substrate holder 101 from the side and the bottom. The cup 109 is communicated with an upstream end of the cyclic path 12 via a through hole (not shown) formed on a bottom portion 109a thereof. The phosphoric acid solution 3 ejected onto the semiconductor substrate 20 is moved to the outer circumferential edge of the semiconductor substrate 20 by centrifugal force generated by the rotation of the semiconductor substrate 20 and then drops from the outer circumferential edge onto the bottom portion 109a of the cup 109. The dropped phosphoric acid solution 3 is flowed back in the cyclic path 12 by suction force of the pump 15, passes through the filter 16, and then is supplied to the intermediate tank 17. The silica deposition suppressor 4 and the oxidant 40 are supplied to the phosphoric acid solution 3 supplied to the intermediate tank 17 similarly in the second embodiment. Accordingly, the silica deposition suppressor 4 and the oxidant 40 having been depleted in a reaction with the silicon nitride films 222 can be replenished and the phosphoric acid solution 3 can be reused for removal of the silicon nitride films 222. To enable removal of foreign substances in the phosphoric acid solution 3 in the fluid conduit 106A, the filter 16 can be placed on the fluid conduit 106A, that is, the cyclic path.

To supply a chemical (cleaning liquid) to the semiconductor substrate 20, the nozzle 102B is communicated with a supply source (not shown) of the chemical via the fluid conduit 106B. To control the supply of the chemical, the flow-rate adjustment valve 107B and the on-off valve 108B are placed on the fluid conduit 106B at a predetermined distance. Similarly to the nozzle 102A, the nozzle 102B is fixed to the arm 105 to be capable of facing the central portion of the substrate holder 101. To remove the phosphoric acid solution 3 from the semiconductor substrate 20, the nozzle 102B ejects the chemical to the semiconductor substrate 20 after the silicon nitride films 222 are removed. At that time, the chemical is ejected while the semiconductor substrate 20 is rotated, and thus the phosphoric acid solution 3 can be efficiently removed.

To supply a rinse liquid (pure water, for example) to the semiconductor substrate 20, the nozzle 102C is communicated with a supply source (not shown) of the rinse liquid via the fluid conduit 106C. To control the supply of the rinse liquid, the flow-rate adjustment valve 107C and the on-off valve 108C are placed at a predetermined distance on the fluid conduit 106C. Similarly to the nozzle 102A, the nozzle 102C is fixed to the arm 105 to be capable of facing the central portion of the substrate holder 101. To remove the chemical from the semiconductor substrate 20, the nozzle 102C ejects the rinse liquid to the semiconductor substrate 20 after the cleaning with the chemical. At that time, the rinse liquid is ejected while the semiconductor substrate 20 is rotated, and therefore the chemical can be efficiently removed.

Operations of the rotation driver 104, the flow-rate adjustment valves 107A to 107C, and the on-off valves 108A to 108C can be controlled by a controller (not shown).

Also in the third embodiment, the phosphoric acid solution 3 containing the silica deposition suppressor and the oxidant is supplied to the semiconductor substrate 20 after being heated, to enable the silica deposition to be suppressed and the etching rate of the silicon nitride films 222 to be enhanced similarly in the second embodiment. Furthermore, according to the third embodiment, the removal of the silicon nitride films 222 and the cleaning and rinsing after the removal can be completed by one substrate treatment apparatus 1.

Fourth Embodiment

Figure 15:
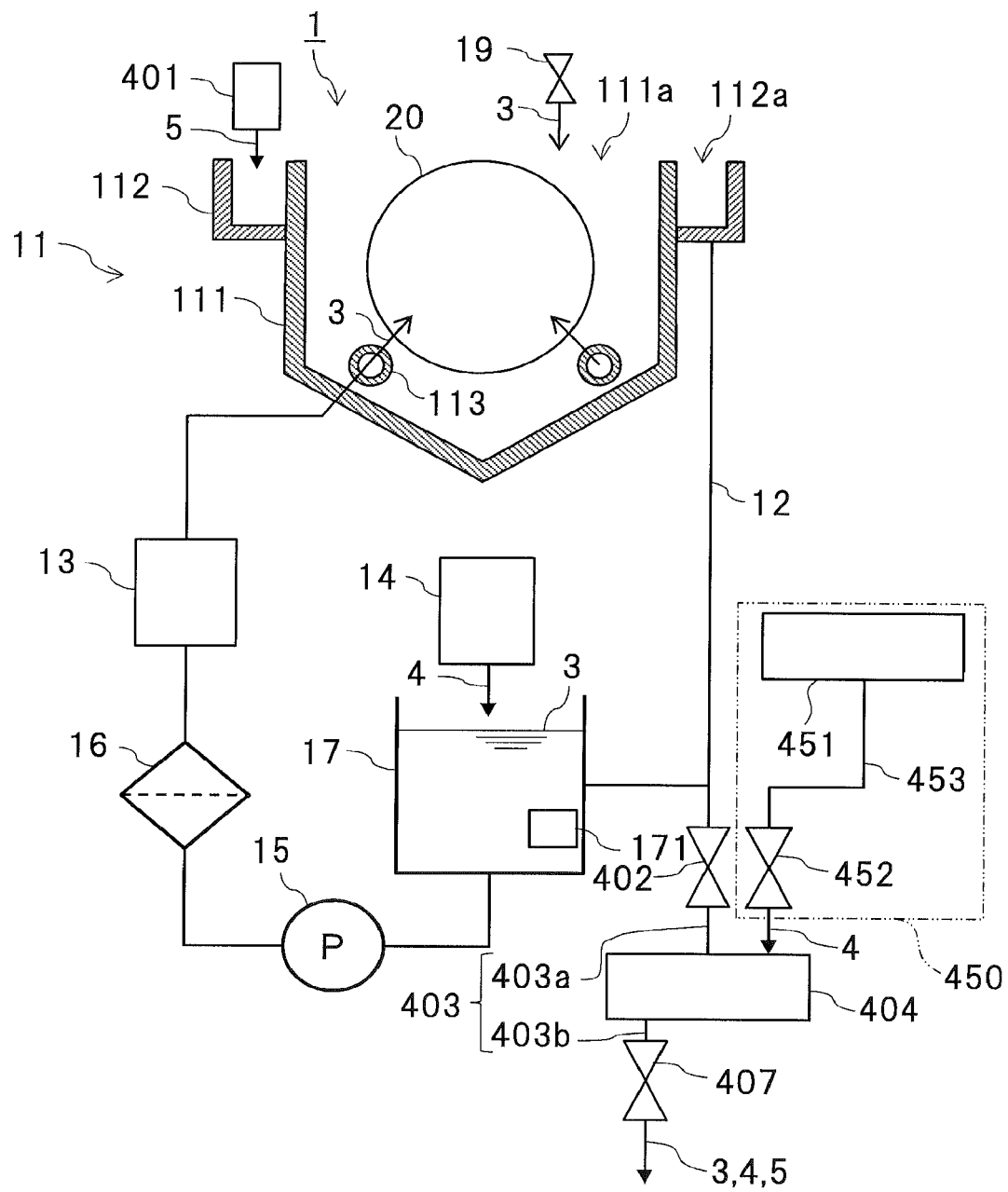
FIG. 15 is a diagram showing a substrate treatment apparatus according to a fourth embodiment.

A substrate treatment apparatus that treats the semiconductor substrate 20 with the phosphoric acid solution 3 having silicon dissolved therein is explained next as a fourth embodiment. In the fourth embodiment, constituent parts corresponding to those in the first embodiment are denoted by like reference characters and redundant descriptions thereof will be omitted. FIG. 15 is a diagram showing the substrate treatment apparatus 1 according to the fourth embodiment.

As shown in FIG. 15, the substrate treatment apparatus 1 according to the fourth embodiment further has a third injector 401, a first valve 402, a discharge path 403, a cooling tank 404 being an example of a cooler, a supplier 450, and a third valve 407 in addition to the configuration of the substrate treatment apparatus 1 shown in FIG. 1. The supplier 450 has a deposition-suppressor solution tank 451, a second valve 452, and a supply path 453.

The third injector 401 is placed to face the upper end opening 112a of the outer tank 112. The third injector 401 injects silicon 5 into the outer tank 112 through the upper end opening 112a. For example, the silicon 5 injected by the third injector 401 can be a mode of a solution of silicon dissolved into a solvent or can be a mode of powder. Injection of the silicon 5 causes the silicon 5 to be dissolved into the phosphoric acid solution 3 in the outer tank 112. The silicon 5 dissolved into the phosphoric acid solution 3 in the outer tank 112 passes through the cyclic path 12 together with the phosphoric acid solution 3 and is supplied to the inner tank 111, that is, in the treatment tank 11. Accordingly, the treatment tank 11 can remove the silicon nitride films 222 from the semiconductor substrate 20 with the phosphoric acid solution 3 having the silicon 5 dissolved therein. Use of the phosphoric acid solution 3 having the silicon 5 dissolved therein enables the etching selectivity of the silicon nitride films 222 against the silicon dioxide films 221 to be increased. The intermediate tank 17 and the first injector 14 can be omitted and the injector 401 can serve as a substitute of the intermediate tank 17 and the first injector 14.

To increase the etching selectivity of the silicon nitride films 222 against the silicon dioxide films 221, the heater 13 heats the phosphoric acid solution 3 to a second temperature T2 being a target temperature of the phosphoric acid solution 3 in the treatment tank 11. The second temperature T2 can also be referred to as a process temperature at which the semiconductor substrate 20 is treated in the treatment tank 11. The second temperature T2 is, for example, equal to or higher than 150° C. When the temperature is equal to or higher than 150° C., the saturated dissolved concentration of the silicon 5 steeply increases with temperature increases. Therefore, when the semiconductor substrate 20 is treated with the phosphoric acid solution 3 at a temperature equal to or higher than 150° C., a large amount of the silicon 5 can be dissolved into the phosphoric acid solution 3. Accordingly, the etching selectivity of the silicon nitride films 222 against the silicon dioxide films 221 can be further increased while the silica deposition is suppressed. Meanwhile, if the phosphoric acid solution 3 at the second temperature T2 is introduced as it is to the discharge path 403 after the substrate treatment, heat of the phosphoric acid solution 3 may damage the discharge path 403. It is desirable that the phosphoric acid solution 3 flowing through the discharge path 403 be cooled to prevent the high-temperature phosphoric acid solution 3 from damaging the discharge path 403. The cooling tank 404 is provided to cool the phosphoric acid solution 3 flowing through the discharge path 403.

The concentration of the silicon 5 dissolved in the phosphoric acid solution 3 is higher than a first saturated dissolved concentration S1 corresponding to a first temperature T1 being a target temperature of the phosphoric acid solution 3 in the discharge path 403 and is lower than a second saturated dissolved concentration S2 corresponding to the second temperature being the target temperature of the phosphoric acid solution 3 in the treatment tank 11. The first temperature T1 can also be referred to as a target temperature of cooling of the phosphoric acid solution 3 by the cooling tank 404. The second temperature T2 can also be referred to as a target temperature of heating of the phosphoric acid solution 3 by the heater 13. The first temperature T1 can be, for example, a temperature equal to or lower than 80° C.

By setting the concentration of the dissolved silicon 5 to be higher than the first saturated dissolved concentration S1 and lower than the second saturated dissolved concentration S2, the concentration of the dissolved silicon 5 can be enhanced while deposition of the silicon 5 is suppressed. This enables the etching selectivity of the silicon nitride films 222 against the silicon dioxide films 221 to be further enhanced.

The third injector 401 can alternatively inject the silicon 5 into the inner tank 111. As a method of dissolving the silicon 5 other than injecting the silicon 5 using the third injector 401, silicon contained in the silicon nitride films 222 that have been selectively removed from the semiconductor substrate 20 using the phosphoric acid solution 3 in the treatment tank 11 can be dissolved into the phosphoric acid solution 3, for example. In this case, in the next processing of the semiconductor substrate 20, the semiconductor substrate 20 can be treated with the phosphoric acid solution 3 having the silicon dissolved therein.

The discharge path 403 is communicated with the cyclic path 12. The discharge path 403 has a discharge path 403a on an upstream side of the cooling tank 404, and a discharge path 403b on a downstream side of the cooling tank 404. The cooling tank 404 itself can constitute a part of the discharge path 403. For example, the discharge path 403 discharges the phosphoric acid solution 3 having been used for the treatment of the semiconductor substrate 20 a predetermined number of times to outside of the substrate treatment apparatus 1. The first valve 402, the cooling tank 404, and the third valve 407 are placed on the discharge path 403 in this order from an upstream side.

The first valve 402 is capable of opening and closing the upstream discharge path 403a. By opening the first valve 402, the phosphoric acid solution 3 is introduced into the upstream discharge path 403a. The first valve 402 and other valves 407 and 452 can be, for example, solenoid valves.

The cooling tank 404 retains therein the phosphoric acid solution 3 introduced by the first valve 402 into the upstream discharge path 403a until a predetermined cooling time passes. The cooling tank 404 cools the retained phosphoric acid solution 3 to the first temperature T1. By cooling the phosphoric acid solution 3, damages of the downstream discharge path 403b due to heat of the phosphoric acid solution 3 can be avoided. A specific mode of a cooling method of the cooling tank 404 is not particularly limited. For example, the cooling tank 404 can cool the phosphoric acid solution 3 by heat exchange with a refrigerant such as water or gas.

The third valve 407 is capable of opening and closing the discharge path 403b on the downstream side of the cooling tank 404. The third valve 407 opens after waiting for passage of the predetermined cooing time from introduction of the phosphoric acid solution 3 into the cooling tank 404. This causes the third valve 407 to introduce the phosphoric acid solution 3 cooled to the first temperature T1 in the cooling tank 404 into the downstream discharge path 403b.

The supplier 450 supplies the silica deposition suppressor 4 to the phosphoric acid solution 3 flowing through the downstream discharge path 403b. The supply of the silica deposition suppressor 4 enables suppression of the silica deposition in the downstream discharge path 403b to prevent clogging of the discharge path 403b.

In the example shown in FIG. 15, the supplier 450 supplies the silica deposition suppressor 4 to the phosphoric acid solution 3 in the cooling tank 404. Specifically, the deposition-suppressor solution tank 451 retains therein a solution of the silica deposition suppressor 4 on an upstream end of the supply path 453. A downstream end of the supply path 453 is connected to the cooling tank 404. The second valve 452 is capable of opening and closing the supply path 453 between the deposition-suppressor solution tank 451 and the cooling tank 404. By opening the second valve 452, the silica deposition suppressor 4 in the deposition-suppressor solution tank 451 is introduced into the cooling tank 404 through the supply path 453.

The supply of the silica deposition suppressor 4 into the phosphoric acid solution 3 flowing through the discharge path 403 is performed when the phosphoric acid solution 3 has a temperature higher than a third temperature T3 corresponding to the saturated dissolved concentration of the silicon 5. The third temperature T3 is higher than the first temperature T1 and is lower than the second temperature T2. In the example shown in FIG. 15, the temperature of the phosphoric acid solution 3 introduced into the cooling tank 404 is higher than the third temperature T3 until heat exchange with a refrigerant (not shown) sufficiently progresses in the cooling tank 404. The supplier 450 supplies the silica deposition suppressor 4 to the phosphoric acid solution 3 before the temperature of the phosphoric acid solution 3 introduced into the cooling tank 404 reaches the third temperature T3 due to cooling. For example, at a timing when a new phosphoric acid solution 3 is introduced into the cooling tank 404 with opening of the first valve 402, the supplier 450 can supply the silica deposition suppressor 4 to the phosphoric acid solution 3 newly introduced.

By supplying the silica deposition suppressor 4 to the phosphoric acid solution 3 that has a higher temperature than the third temperature T3, deposition of the silicon 5 can be prevented before occurring. The supplier 450 can alternatively supply the silica deposition suppressor 4 to the upstream discharge path 403a. Also in this case, the silica deposition suppressor 4 can be supplied to the phosphoric acid solution 3 when the temperature of the phosphoric acid solution 3 is higher than the third temperature T3 and thus deposition of the silicon 5 can be prevented before occurring.

Figure 16A:
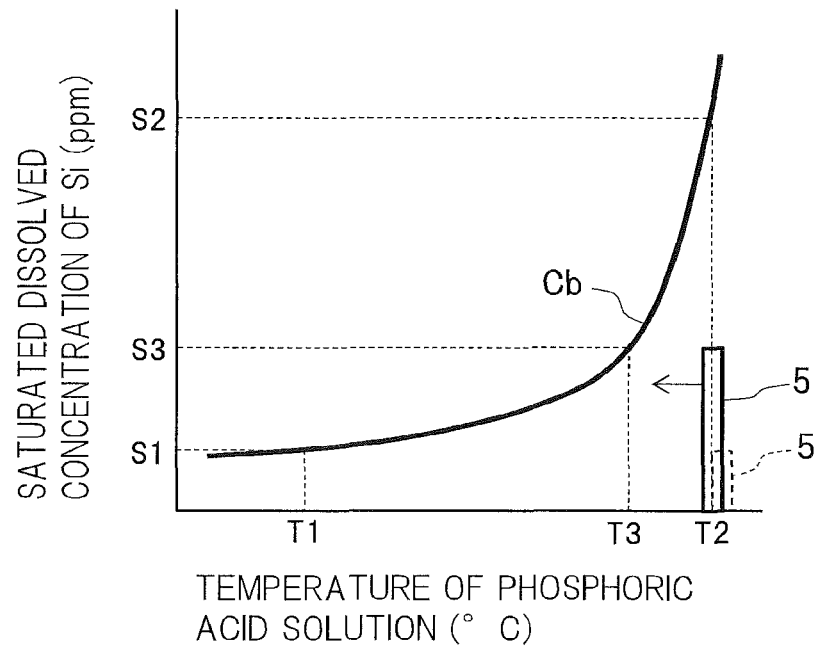
FIG. 16A is a graph showing a saturated dissolved concentration curve of silicon before a silica deposition suppressor is supplied in a substrate treatment method according to the fourth embodiment.

FIG. 16A is a graph showing a saturated dissolved concentration curve Cb of the silicon 5 before the silica deposition suppressor 4 is supplied in a substrate treatment method according to the fourth embodiment. In FIG. 16A, the horizontal axis represents the temperature of the phosphoric acid solution 3 and the vertical axis represents the saturated dissolved concentration of the silicon 5. In FIG. 16A, the dissolved concentration of the silicon 5 that is dissolved in the phosphoric acid solution 3 at the second temperature T2 is indicated by a solid-line bar graph denoted by sign 5. As indicated by the solid-line bar graph, the dissolved concentration of the silicon 5 in the present embodiment is higher than the first saturated dissolved concentration S1 at the first temperature T1 and is lower than the second saturated dissolved concentration S2 at the second temperature T2.

If the silica deposition suppressor 4 is not supplied to the phosphoric acid solution 3 flowing through the discharge path 403, the dissolved concentration of the silicon 5 needs to be equal to or lower than the first saturated dissolved concentration S1 as indicated by a dashed-line bar graph denoted by sign 5 in FIG. 16A. This is because, when the dissolved concentration of the silicon 5 is set to be higher than the first saturated dissolved concentration S1 without supplying the silica deposition suppressor 4, the dissolved concentration exceeds the first saturated dissolved concentration S1 along with cooling of the phosphoric acid solution 3, which causes the silicon 5 to deposit on the discharge path 403.

Figure 16B:
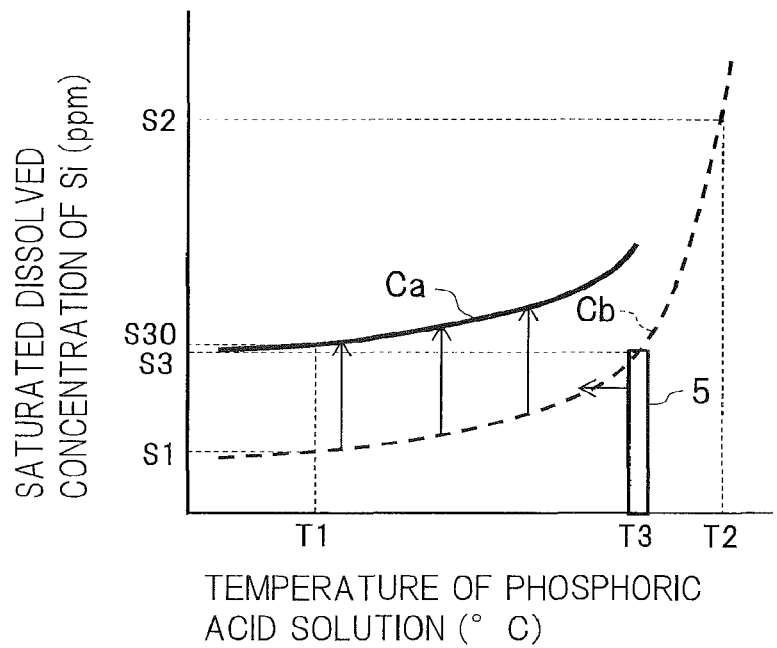
FIG. 16B is a graph showing a saturated dissolved concentration curve of silicon after the silica deposition suppressor is supplied in the substrate treatment method according to the fourth embodiment.

In contrast thereto, in the present embodiment, the deposition of the silicon 5 along with cooling of the phosphoric acid solution 3 can be suppressed by supply of the silica deposition suppressor 4 to the phosphoric acid solution 3. The silica deposition suppressor 4 suppresses the deposition of the silicon 5 by raising the saturated dissolved concentration curve of the silicon 5, for example, as shown in FIG. 16B explained below. Because the deposition of the silicon 5 can be suppressed, the dissolved concentration of the silicon 5 can be set to a value S3 higher than the first saturated dissolved concentration S1 as indicated by the solid-line bar graph in FIG. 16A. This can increase the etching selectivity of the silicon nitride films 222 against the silicon dioxide films 221 and can suppress the deposition of the silicon 5 on the discharge path 403.

FIG. 16B is a graph showing a saturated dissolved concentration curve Ca of the silicon 5 after the silica deposition suppressor 4 is supplied in the substrate treatment method according to the fourth embodiment.

In the fourth embodiment, the silica deposition suppressor 4 is supplied to the phosphoric acid solution 3 when the temperature of the phosphoric acid solution 3 is higher than the third temperature T3 corresponding to the saturated dissolved concentration S3 of the silicon 5. Due to the supply of the silica deposition suppressor 4 to the phosphoric acid solution 3 when the temperature of the phosphoric acid solution 3 is higher than the first temperature T1 (ex. T3), the silicon 5 can be prevented from starting depositing when the phosphoric acid solution 3 is cooled to the first temperature T1 in the cooling tank 404. This is because, for example, a raise of the saturated dissolved concentration curve from Cb to Ca due to addition of the silica deposition suppressor 4 can increase the saturated dissolved concentration at the first temperature T1 from S1 to S30 (the second saturated concentration) as shown in FIG. 16B. The raise of the saturated dissolved concentration curve from Cb to Ca is backed by the results shown in FIGS. 5, 7, 8, 9, 10, and 11. Therefore, the supply of the silicon deposition suppressor 4 to the phosphoric acid solution 3 when the temperature of the phosphoric acid solution 3 is higher than the third temperature T3 can avoid the deposition of the silicon 5 before occurring. The third injector 401 (controller) controls a silica concentration of the phosphoric acid solution 3 in the treatment part 11 to a concentration between S1 and S30. That is, the third injector 401 controls a silica concentration of the phosphoric acid solution 3 in the treatment part 11 to a concentration equal to or higher than the first saturated dissolved concentration S1 and lower than the second saturated dissolved concentration S30.

As explained above, according to the fourth embodiment, the etching selectivity of the silicon nitride films 222 against the silicon dioxide films 221 in the treatment tank 11 can be increased and therefore the treatment efficiency of the semiconductor substrate 20 can be enhanced. Furthermore, due to previous avoidance of the deposition of the silicon 5, clogging of the discharge path 403 can be prevented.

Figure 17:
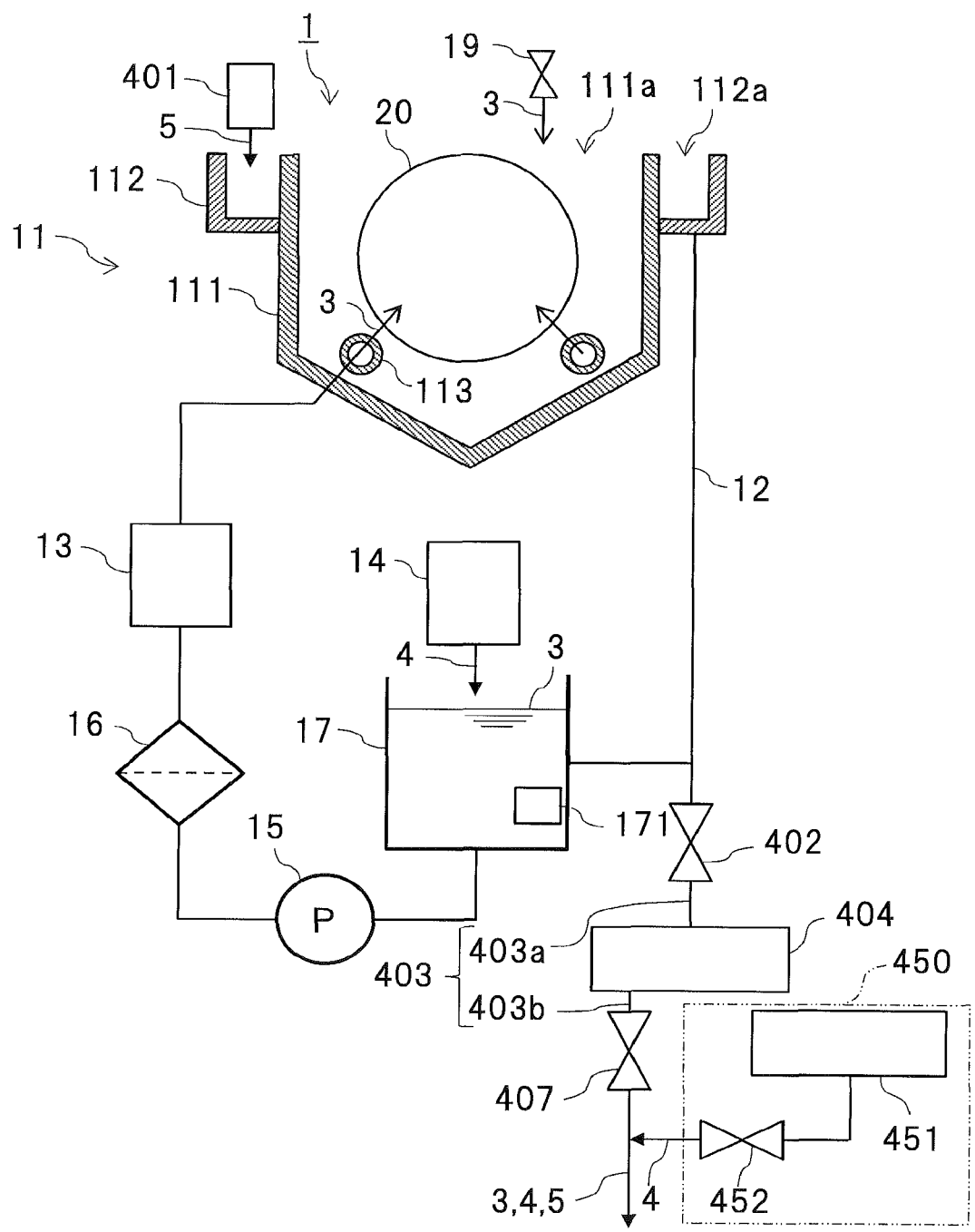
FIG. 17 is a diagram showing a substrate treatment apparatus according to a modification of the fourth embodiment.

FIG. 17 is a diagram showing the substrate treatment apparatus 1 according to a modification of the fourth embodiment. The example in which the deposition of the silicon 5 is avoided before occurrence has been explained with reference to FIG. 15. In the present modification, the deposition of the silicon 5 is addressed after occurrence.

Specifically, as shown in FIG. 17, in the substrate treatment apparatus 1 according to the present modification, the supplier 450 supplies the silica deposition suppressor 4 to the phosphoric acid solution 3 flowing through the downstream discharge path 403b. In the phosphoric acid solution 3 downstream from the cooling tank 404, there is the silicon 5 deposited due to cooling in the cooling tank 404. However, in the present modification, the deposited silicon 5 can be dissolved by the silica deposition suppressor 4 immediately after the deposition. Accordingly, the deposition of the silicon 5 is eliminated after occurrence and clogging of the discharge path 403b can be prevented.

Note that the fourth embodiment can be combined with the second embodiment or the third embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An etchant removing silicon nitride, wherein
the etchant containing 75 wt % to 94 wt % of phosphoric acid and 0.01 wt % to 3.2 wt % of a silica deposition suppressor,
the silica deposition suppressor containing at least one compound selected from a group comprising oxide, nitride, chloride, bromide, hydroxide, and nitrate of any of potassium, lithium, sodium, magnesium, calcium, zirconium, tungsten, titanium, molybdenum, hafnium, nickel, and chromium,
the silica deposition suppressor added to the phosphoric acid in a manner that the silica deposition suppressor in the phosphoric acid has a concentration of 0.01 mol/L to 0.5 mol/L,
the etchant containing an oxidant having a redox potential equal to or higher than 1.0 V, and
the silica deposition suppressor containing an element that is a cation having an ionic radius of 0.2 Å to 0.9 Å.

2. The etchant of claim 1, containing 0.01 wt % to 2.0 wt % of the oxidant.

3. The etchant of claim 1, comprising an element becoming a cation having a hydration number equal to or smaller than 3.5.

* * * * *